US012766552B2

(12) United States Patent
Theuss et al.

(10) Patent No.: US 12,766,552 B2
(45) Date of Patent: Oct. 20, 2026

(54) DEVICE WITH ULTRASONIC TRANSDUCER AND METHOD FOR MANUFACTURING SAME

(71) Applicant: Infineon Technologies AG, Neubiberg (DE)

(72) Inventors: Horst Theuss, Wenzenbach (DE); Klaus Elian, Alteglofsheim (DE)

(73) Assignee: Infineon Technologies AG, Neubiberg (DE)

( * ) Notice: Subject to any disclaimer, the term of this patent is extended or adjusted under 35 U.S.C. 154(b) by 249 days.

(21) Appl. No.: 18/366,278

(22) Filed: Aug. 7, 2023

(65) Prior Publication Data

US 2024/0058841 A1 Feb. 22, 2024

(30) Foreign Application Priority Data

Aug. 17, 2022 (DE) ......................... 102022120750.1

(51) Int. Cl.

| | |
|---|---|
| ***B06B 1/02*** | (2006.01) |
| ***B06B 1/06*** | (2006.01) |
| ***G06F 3/043*** | (2006.01) |
| ***H02N 1/00*** | (2006.01) |
| ***H10N 30/20*** | (2023.01) |
| ***H10N 30/30*** | (2023.01) |

(52) U.S. Cl.

CPC .......... *B06B 1/0292* (2013.01); *B06B 1/0622* (2013.01); *G06F 3/043* (2013.01); *B06B 1/0607* (2013.01); *B81C 2203/07* (2013.01); *H02N 1/006* (2013.01); *H03K 2217/96007* (2013.01); *H10N 30/20* (2023.02); *H10N 30/30* (2023.02)

(58) Field of Classification Search

CPC ................ B06B 1/0292; B06B 1/0622; H03K 2217/96007; B81C 2203/07; G06F 3/043; H02N 1/006; B81B 3/0021

USPC .................................................. 310/309, 310

See application file for complete search history.

(56) References Cited

U.S. PATENT DOCUMENTS

| | | | | |
|---|---|---|---|---|
| 7,998,091 | B2 * | 8/2011 | Carim .................... | G01N 29/14 600/534 |
| 8,398,551 | B2 * | 3/2013 | Adachi ................ | A61B 8/4483 600/407 |
| 8,907,544 | B2 * | 12/2014 | Naka ...................... | A61B 8/546 310/334 |
| 10,911,861 | B2 * | 2/2021 | Buckland ............... | G10K 11/02 |
| 2004/0256959 | A1 * | 12/2004 | Ladabaum ............ | B06B 1/0292 310/348 |
| 2006/0230605 | A1 * | 10/2006 | Schlote-Holubek ......................... | B06B 1/0607 29/609.1 |

(Continued)

FOREIGN PATENT DOCUMENTS

| | | |
|---|---|---|
| CN | 102150485 A | 8/2011 |
| CN | 103418542 A | 12/2013 |

(Continued)

*Primary Examiner* — Oluseye Iwarere
*Assistant Examiner* — Daniel K Schlak
(74) *Attorney, Agent, or Firm* — Harrity & Harrity, LLP

(57) ABSTRACT

Device with ultrasonic transducer and method for manufacturing same. A device is provided, having an ultrasonic transducer, which includes a membrane and a cover element. A coupling medium entirely fills an interspace between the membrane and the cover element, and extends from the interspace into a reservoir space which communicates with the interspace.

20 Claims, 10 Drawing Sheets

(56) References Cited

U.S. PATENT DOCUMENTS

| | | | | |
|---|---|---|---|---|
| 2007/0164631 | A1* | 7/2007 | Adachi | G01N 29/245 310/311 |
| 2009/0152980 | A1* | 6/2009 | Huang | B06B 1/0292 310/309 |
| 2009/0218668 | A1* | 9/2009 | Zhe | B81C 1/00301 257/E23.18 |
| 2010/0036257 | A1* | 2/2010 | Sano | A61B 8/4281 600/459 |
| 2011/0164383 | A1 | 7/2011 | Kadijk et al. | |
| 2011/0227449 | A1* | 9/2011 | Nakamura | A61B 8/4444 310/317 |
| 2011/0304572 | A1* | 12/2011 | Wang | G06F 3/041 345/173 |
| 2013/0072796 | A1* | 3/2013 | Nakamura | A61B 8/4281 600/443 |
| 2014/0211587 | A1* | 7/2014 | Kiyose | G01S 7/52053 367/87 |
| 2014/0265721 | A1* | 9/2014 | Robinson | H02N 1/006 310/300 |
| 2015/0139457 | A1 | 5/2015 | Onishi et al. | |
| 2015/0168354 | A1* | 6/2015 | Kandori | G01N 29/2418 73/627 |
| 2015/0200350 | A1 | 7/2015 | Hajati et al. | |
| 2015/0290679 | A1* | 10/2015 | Kandori | G10K 11/004 367/181 |
| 2016/0036412 | A1* | 2/2016 | Suzuki | B06B 1/067 310/311 |
| 2016/0101437 | A1* | 4/2016 | Chen | H03H 3/0072 310/300 |
| 2016/0282454 | A1* | 9/2016 | Ohashi | G01S 7/526 |
| 2017/0110504 | A1* | 4/2017 | Panchawagh | B06B 1/0207 |
| 2017/0179368 | A1* | 6/2017 | Sumi | B41J 2/14233 |
| 2017/0323130 | A1* | 11/2017 | Dickinson | A61B 8/02 |
| 2018/0226564 | A1* | 8/2018 | Itayama | B06B 1/06 |
| 2019/0080132 | A1* | 3/2019 | Jin | H10N 30/101 |
| 2019/0193116 | A1* | 6/2019 | Horsley | G10K 9/122 |
| 2019/0229254 | A1* | 7/2019 | Smeys | G10K 11/02 |
| 2019/0335262 | A1* | 10/2019 | Szczech | B81C 1/00158 |
| 2020/0382862 | A1* | 12/2020 | Hrudey | H04R 31/00 |
| 2020/0402879 | A1* | 12/2020 | Tseng | B06B 1/0629 |
| 2020/0413202 | A1 | 12/2020 | Kusano et al. | |
| 2021/0264888 | A1* | 8/2021 | Dixon | H10N 30/88 |
| 2022/0362804 | A1* | 11/2022 | Chiu | B06B 1/0629 |

FOREIGN PATENT DOCUMENTS

| | | | | | |
|---|---|---|---|---|---|
| CN | 105310719 | A | | 2/2016 | |
| CN | 105873689 | A | | 8/2016 | |
| CN | 215030804 | U | | 12/2021 | |
| CN | 114303122 | A | | 4/2022 | |
| DE | 102015202396 | A1 | * | 8/2016 | B06B 1/0622 |
| JP | 2004141428 | A | * | 5/2004 | A61B 8/00 |

* cited by examiner

DEVICE WITH ULTRASONIC TRANSDUCER AND METHOD FOR MANUFACTURING SAME

CROSS REFERENCE TO RELATED APPLICATION

This application claims priority to German Patent Application No. 102022120750.1 filed on Aug. 17, 2022, the content of which is incorporated by reference herein in its entirety.

TECHNICAL FIELD

The present implementation relates to devices which comprise an ultrasonic transducer, and to methods for manufacturing such devices.

BACKGROUND

Ultrasonic transducers are devices which, in response to an electrical signal, for example an AC voltage, transmit an ultrasonic signal, convert an ultrasonic signal into an electrical signal, or are configured to execute both functions. Ultrasonic transducers of this type typically comprise a membrane which can be caused to oscillate, and which forms a first electrode. A second electrode is configured in a stationary arrangement. If an AC voltage is applied between the electrodes, the membrane oscillates and, at an appropriate frequency of the AC voltage, generates ultrasonic signals. Conversely, the membrane can be caused to oscillate by ultrasonic signals, thereby altering the capacitance between the electrodes which, in turn, can be measured.

Using devices of this type, in particular, ultrasonic signals in the range of 2 to 10 MHz can be generated or received. Ultrasonic transducers can be implemented in the form of micro-electromechanical systems (MEMS), for example based upon silicon.

In some applications, it is desirable for the ultrasonic transducer to be acoustically coupled to a surface, for example for the implementation of touch-sensitive panels which can be employed, for example, as control elements. To this end, typically, a coupling medium such as a gel is applied between one or more membranes of the ultrasonic transducer and a plate element. However, coupling media of this type typically assume coefficients of thermal expansion which differ from the coefficients of thermal expansion of other components, such as the ultrasonic transducer and the plate element. As a result, sound transmission between the plate element and the membrane or membranes of the ultrasonic transducer can be compromised.

SUMMARY

A device is provided as claimed in claim 1, a system having a device of this type as claimed in claim 16, and a method as claimed in claim 17. Further implementations are defined in the sub-claims.

According to one example implementation, a device is provided, including:

- an ultrasonic transducer having a membrane,
- a cover element which is spaced from the ultrasonic transducer, and
- a coupling medium, which entirely fills an interspace between the membrane and the cover element, and which extends from the interspace into a reservoir space, which communicates with the interspace.

According to a further example implementation, a system is provided, including a plate element and the above-mentioned device. The cover element is fitted to a side of the plate element which is averted from the ultrasonic transducer.

Finally, a method is provided for manufacturing an above-mentioned device, including the provision of the ultrasonic transducer, the provision of the cover element, and the provision of the coupling medium in the interspace and in at least part of the reservoir space.

The above summary includes only a brief overview of a number of implementations, and is not provided by way of limitation.

DETAILED DESCRIPTION

Various example implementations are described in detail hereinafter. These are intended to be illustrative only, and are not provided by way of limitation.

Accordingly, features of various example implementations can be mutually combined. Variations and modifications which are described for one example implementation are also applicable to other example implementations and, in consequence, are not described separately for each example implementation.

Figure 4A:
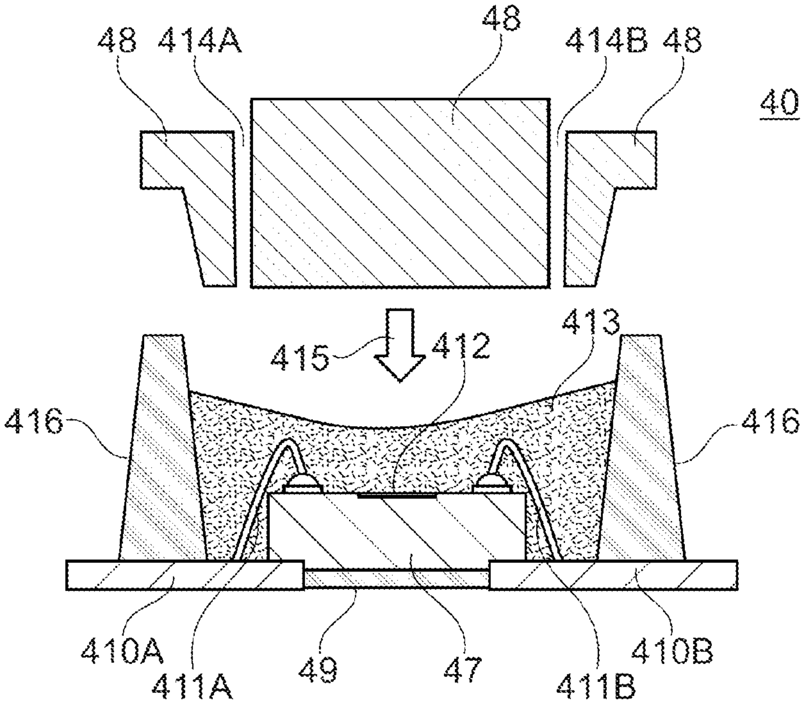
FIGS. 4A and 4B illustrate a device according to a further example implementation.
Figure 4B:
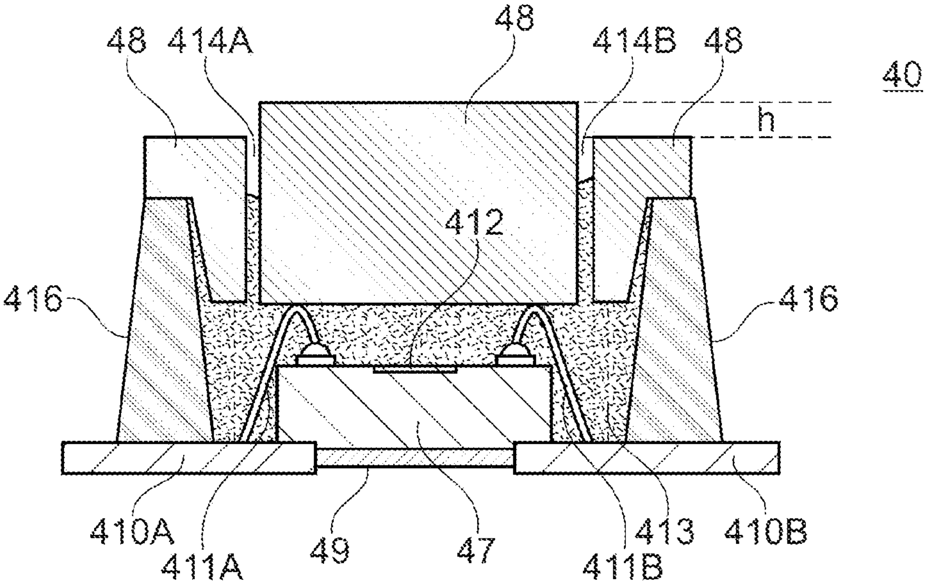
Figure 4C:
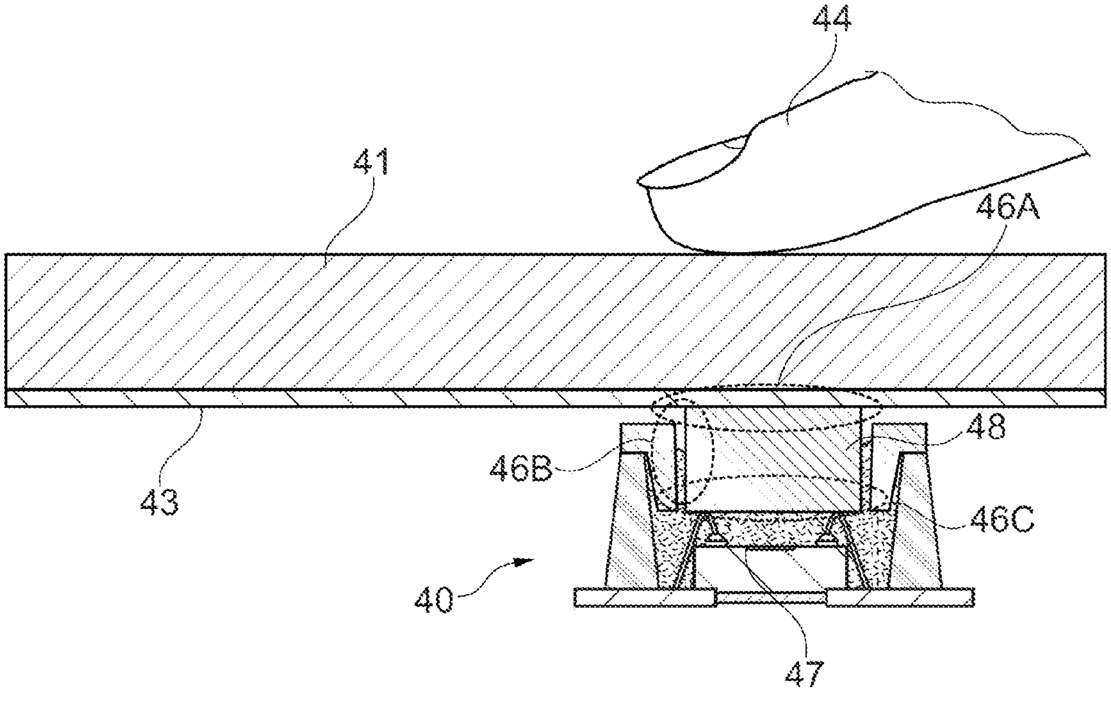
FIG. 4C shows a system having a device of this type.

Figures having a plurality of sub-figures are identified overall by the figure number. FIG. 4 thus describes FIGS. 4A to 4C, and FIG. 6 describes the combination of FIGS. 6A to 6E.

Figure 1:
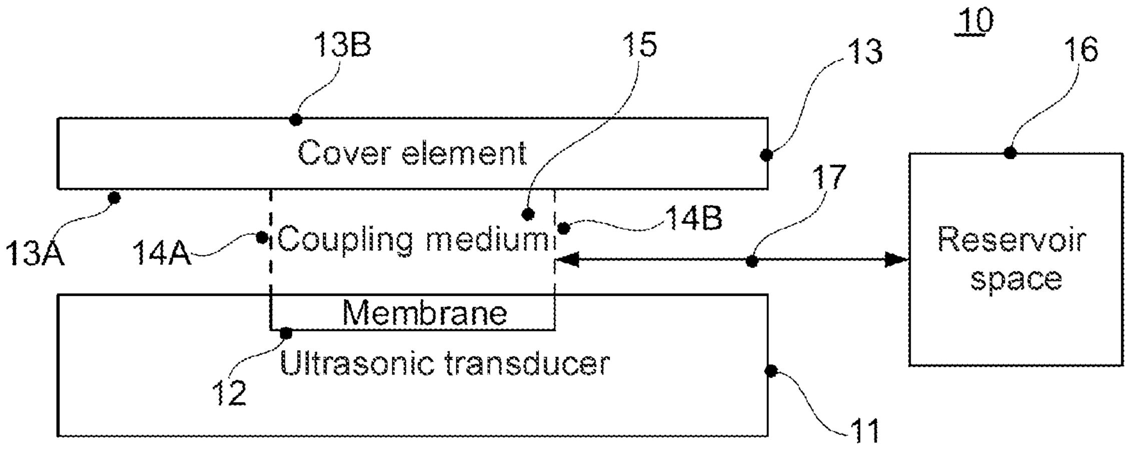
FIG. 1 shows a schematic block diagram of a device according to one example implementation.

FIG. 1 shows a schematic representation of a device according to one example implementation. The device 10 comprises an ultrasonic transducer 11 having a membrane 12. As described hereinafter with reference to FIGS. 2A and 2B, with respect to one example implementation, for example, the membrane 12 can be caused to oscillate by the ultrasonic transducer 11, in order to transmit ultrasound, and/or the membrane 12 can be caused to oscillate by incoming ultrasound, and a resulting variation in electrical capacitance in the ultrasonic transducer can be measured. The ultrasonic transducer 11 can particularly operate using ultrasound at frequencies in a range of 2 to 10 MHz.

The device 10 further comprises a cover element 13, having a side 13A which faces the ultrasonic transducer 11, particularly the membrane 12, and a side 13B which is averted from the ultrasonic transducer 11. In some example implementations, which are described hereinafter, the cover element can be fastened at its side 13B to a plate element, in order to form a touch-sensitive assembly. To this end, side 13B in particular can be at least substantially flat, for example in a central region which is arranged above the membrane, in order to permit a secure attachment to the plate element.

In an interspace between the membrane 12 and the side 13A of the cover element 12 facing the ultrasonic transducer 11, a coupling medium 15 is arranged such that it entirely fills this interspace. In the example implementation according to FIG. 1, the interspace, as indicated by lines 14A and 14B, at least comprises a space which corresponds to a cylinder having the membrane 12 as its base surface, and having the projection of the membrane 12 onto the side 13A as its top surface. The coupling medium 15 can also extend beyond this interspace. Externally to the interspace, however, the coupling medium can also incorporate e.g., voids or bubbles, given that, for sound transmission between the membrane 12 and the cover element 13 it is critical that the interspace, as indicated by lines 14A and 14B, should be entirely filled, whereas a region outside the interspace does not contribute, or only contributes to a significantly lesser extent to the sound transmission of ultrasound.

The coupling medium is a material which permits sound transmission between the membrane 12 and the cover element 13. The coupling medium can be, for example, an elastic gel, such as a silicone gel.

The interspace in which the coupling medium 15 is located is fluidically connected to a reservoir space 16, wherein the fluidic connection is indicated by an arrow 17. The coupling medium 15 extends from the interspace between the membrane 12 and the cover element 13 at least partially into the reservoir space 16. In the event of thermal expansion, the coupling medium can expand into the reservoir space 16 and, in the event of thermal contraction, coupling medium can enter the interspace from the reservoir space 16, such that the interspace remains entirely filled in the event of temperature fluctuations. In particular, the reservoir space can be dimensioned and partially filled with the coupling medium such that, within a temperature range which is specified for the device 10 (e.g., a temperature range which is conceived for the employment of the device 10), complete filling is maintained at all times. As a result, a consistent acoustic coupling can be maintained between the membrane 12 and the cover element 13, even in the event of temperature fluctuations. Although the reservoir space 16 according to FIG. 1 is represented in a schematically separate arrangement from other elements, it can be configured, for example, in the cover element 13 and/or can be seamlessly connected to the interspace. Examples hereof are described in greater detail hereinafter, with reference to specific example implementations.

Before various implementations of devices 10 of this type are explained, one potential implementation of the ultrasonic transducer 11 will be described with reference to FIGS. 2A and 2B. However, the ultrasonic transducer 11 is not limited to this implementation, and other conventional ultrasonic transducers having a membrane can also be employed.

Figure 2A:
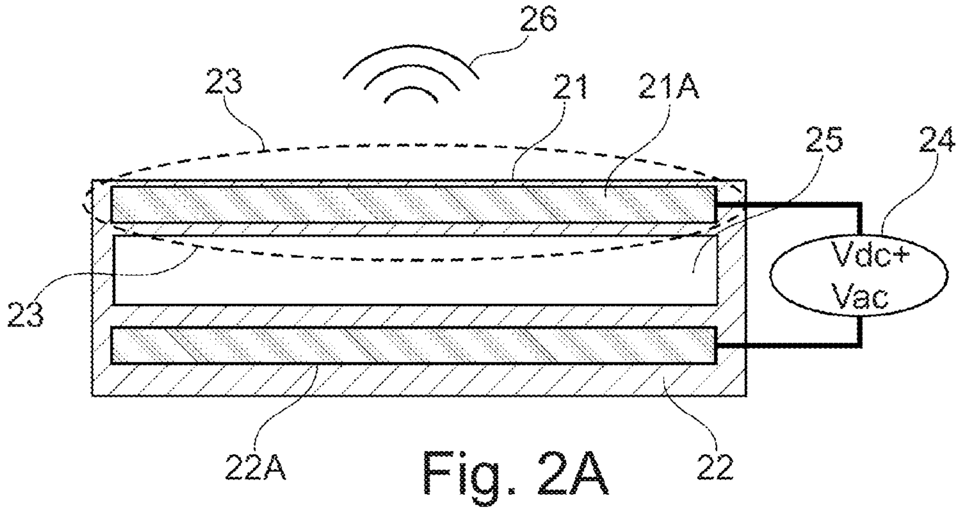
FIGS. 2A and 2B show example implementations of ultrasonic transducers in various example implementations.
Figure 2B:
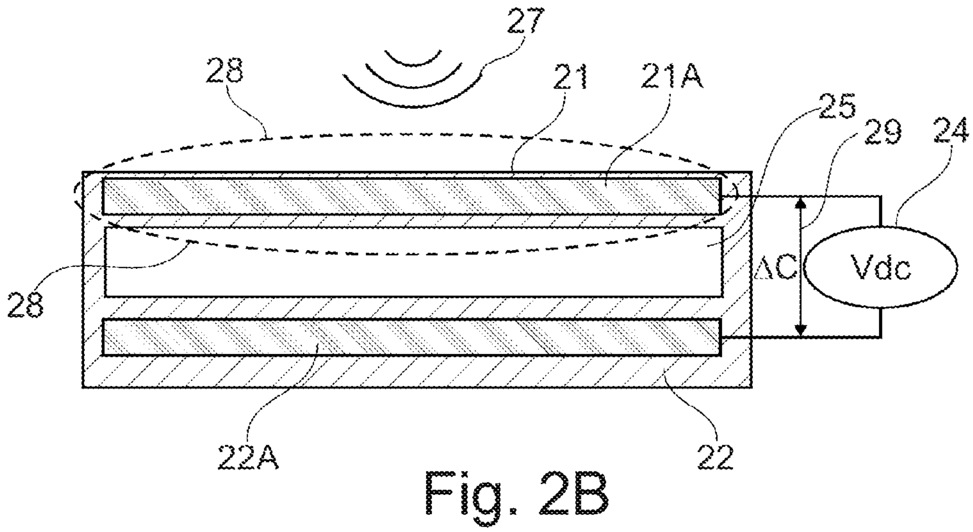

The ultrasonic transducer according to FIGS. 2A and 2B is implemented in the form of a micro-electromechanical system (MEMS) on a silicon substrate 22. Using etching, or similar, a membrane 21, which is separated from the silicon substrate 22 using an interspace 25 in which, for example, a vacuum can be provided. Residual elements of silicon support the membrane 21.

In the silicon substrate 22, a stationary electrode 22A is configured, for example of a heavily doped silicon or a metal and, in the membrane 21, an electrode 21A is configured which can also be formed, for example, of a heavily doped silicon or a metal.

FIG. 2A shows a case in which the ultrasonic transducer is employed for transmitting ultrasound. To this end, using a voltage source 24, a DC voltage Vdc is applied between the electrodes 21A, 22A, upon which an AC voltage Vac is superimposed. The frequency of the AC voltage Vac corresponds to a frequency of ultrasound 26 generated. Using the AC voltage Vac, the membrane 21 is caused to oscillate by the varying electrostatic force between the electrodes 22A, 21A, as indicated by broken lines 23, as a result of which ultrasound is generated.

FIG. 2B shows the case in which ultrasound is received and converted into an electrical signal. In this case, ultrasound 27 is directed against the membrane 21 and causes the latter to oscillate, as indicated by the broken lines 28. A DC voltage Vdc is present between the electrode 21A and the electrode 22A. The oscillation of the membrane 21 generates a variation in capacitance AC between the electrodes 21A, 22A, which can then be detected using a conventional method for capacitance measurement.

Figure 3:
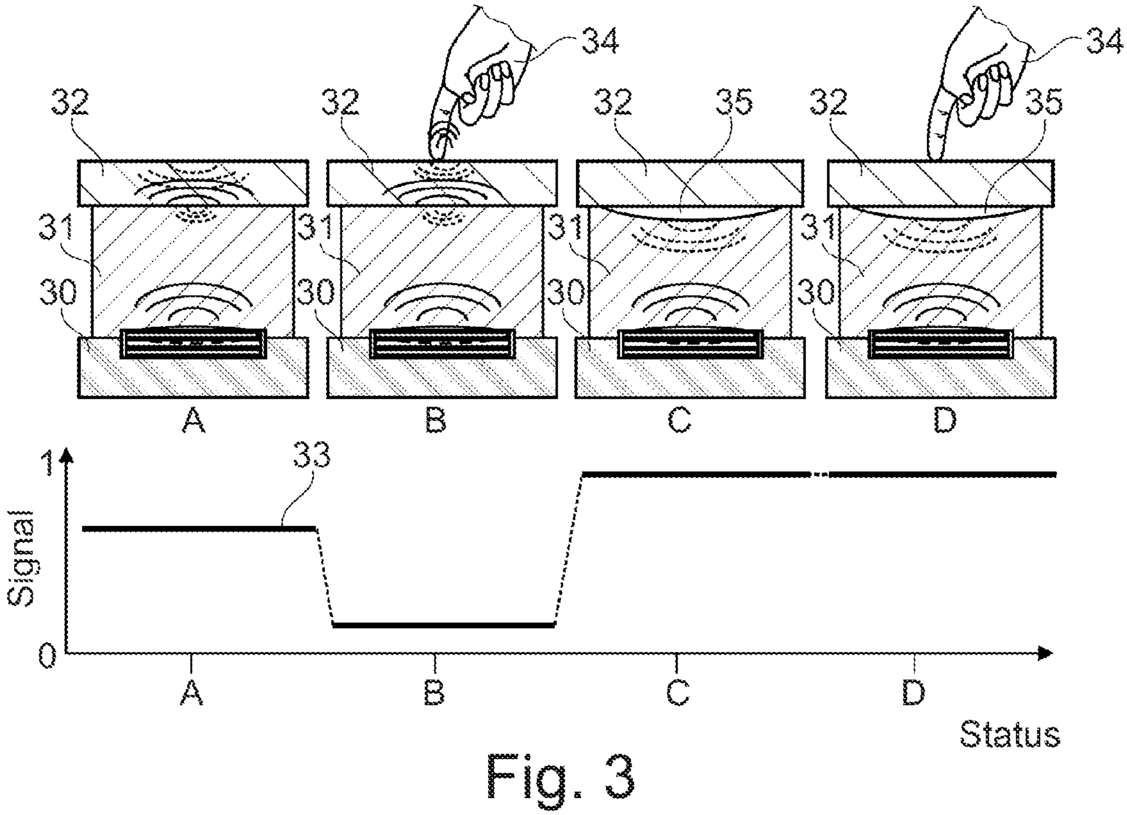
FIG. 3 shows a diagram for the illustration of an example implementation, and the issue of the shrinkage of a coupling medium.

FIG. 3 shows a diagram illustrating the employment of a device having an ultrasonic transducer to form a touch-sensitive element, and moreover illustrates an issue which, in some example implementations, is eliminated, or is at least mitigated by the reservoir space 16 according to FIG. 1. It should be observed that FIG. 3 is provided by way of illustration, and does not show example implementations having a reservoir space.

FIG. 3 shows an ultrasonic transducer 30, which is connected using a coupling medium 31 to a plate element 32, in four different states A to D. The ultrasonic transducer 30 transmits an ultrasonic signal and receives a reflected ultrasonic signal, for example in a duplex operation, wherein, between the transmission represented in FIG. 2A and the reception represented in FIG. 2B, a rapid switchover is executed. In other example implementations, an ultrasonic transducer employed can comprise separate transducer modules for transmission and reception; corresponding example implementations are described hereinafter.

A curve 33 illustrates a signal strength received by the ultrasonic transducer in the reception operating mode.

State A shows a case in which ultrasonic signals are partially reflected at the boundary surface between the coupling medium 31 and the plate element 32, and substantially at the boundary surface between the plate element 32 and the environment, e.g., at the side of the plate element 32 which is averted from the ultrasonic transducer 30. This results in a relatively high signal level, as per the curve 33.

In case B, a finger of a hand 34 touches the plate element, as represented, on the reflection surface. This reduces reflection at the boundary surface, as ultrasound also enters the finger. Accordingly, the signal represented by the curve 33 also reduces. In this manner, the plate element 32 can be employed as a touch-sensitive element, for example as a control element.

In states C and D, the coupling medium, for example on the grounds of differing coefficients of thermal expansion between the ultrasonic transducer 30, the coupling medium 31 and the plate element 32 shows a relative shrinkage (for example in the event of cooling and a higher coefficient of thermal expansion of the coupling medium 31, or in the event of heat-up and a lower coefficient of thermal expansion of the coupling medium 31), such that an interspace 35 is formed between the coupling medium 31 and the plate element 32. As represented in states C and B, ultrasound waves, at least substantially, are reflected at the boundary surface between the coupling medium 31 and the interspace 35. The signal 33, in both state C and in state D, thus assumes a high level, notwithstanding the contact of a finger of the hand 34 with the plate element 32 in state D. It can thus be seen that, in this state, contact detection is no longer functional.

By the provision of the reservoir space 16 according to FIG. 1, in various example implementations, this effect is inhibited, or the occurrence thereof is at least less probable on the grounds that, for example in states C and D, coupling medium is recovered from the reservoir space, in place of the formation of an interspace 35, such that contact is maintained, as previously.

Specific example implementations will now be presented, which represent example implementations of the device 10 according to FIG. 1.

FIG. 4A shows a device 40 according to one example implementation during assembly, and FIG. 4B shows the device 40 in the assembled state.

The device according to FIG. 4A comprises an ultrasonic transducer 47 having a membrane 412. The ultrasonic transducer is fitted to a circuit board 49, which functions as a base element of the device 40. The circuit board 49 comprises printed conductors 410A, 410B, to which terminals of the ultrasonic transducer 47, which are connected to respective electrodes (as per the electrodes 21A, 22A according to FIGS. 2A and 2B), are bonded using bonding wires 411A, 411B. Via the printed conductors 410A, 410B, the voltages Vdc and Vac according to FIGS. 2A and 2B can then be applied, and measurement of the capacitance variation AC according to FIG. 2B can be executed.

The device 40 further comprises sidewalls 416, which enclose the ultrasonic transducer 47.

The device 40 further comprises a cover element 48, which incorporates continuous openings 414A, 414B. It should be observed that the cover element 48 is of one-piece construction, and only appears to be a three-part cover element in the cross-sectional view according to FIG. 4A. In other words, the openings 414A, 414B do not entirely separate the central region of the cover element 48 from the edge regions (c.f. the descriptions of FIG. 7D below).

For the assembly of the device 40, a space between the sidewalls 416, as represented, is filled with the coupling medium 413, such that the coupling medium entirely covers the ultrasonic transducer 47, and extends beyond the latter. Then, as represented by an arrow 415, the cover element 48 is fitted to the side walls 416 and is compressed into the coupling medium 413. The outcome is represented in FIG. 4B.

By the fitting of the cover element 48, the coupling medium 413 is partially compressed into the openings 414A, 414B. The openings 414A, 414B thus form at least part of a reservoir space. In the event of thermal expansion of the coupling medium relative to the cover element 48 and other components of the device 40, the coupling medium 413 can further fill the openings 414A, 414B. In the event of thermal contraction of the coupling medium 413 relative to the cover element 48 and other components of the device 40, the coupling medium 413 can retract from the openings 414A, 414B, thus ensuring that the interspace between the membrane 412 and the cover element 48, independently of thermal expansion or contraction, remains filled with the coupling medium. Other regions which are filled with the coupling medium 413 according to FIG. 4B, for example between the sidewalls and lateral parts of the cover element 48, can also function as part of the reservoir space.

Any description of relative thermal expansion or contraction of the coupling medium 413, as indicated above, is to be understood as relative to the remainder of the device, e.g., cases are described in which the coupling medium 413 shows greater expansion than the remainder of the device, or greater contraction than the remainder of the device.

As represented in FIGS. 4A and 4B, and explicitly illustrated in FIG. 4B, a central region of the cover element 48 is raised vis-à-vis the lateral elements by a height h. It is thus possible for only the central region of the cover element to be applied to a plate element. A corresponding example application is represented in FIG. 4C.

FIG. 4C shows how the device 40 according to FIGS. 4A and 4B, at the surface of the cover element 48 which is averted from the ultrasonic transducer 47, at a central region thereof which is raised by a height h, is fitted to a plate element 41 using a bonding layer 43. It can thus be detected whether e.g., a finger 44 is in contact with the plate element 41, as described in principle with reference to FIG. 3. By way of distinction from FIG. 3, the coupling medium 413, in this case, is not in direct contact with the plate element 41, but sound is ultimately transmitted between the membrane and the plate element 41 via the coupling medium 413 and the cover element 48 and, to a minor extent, also via the bonding layer 43. It should be noted that the thickness of the bonding layer 43 in FIG. 4C is not represented true to scale, and the true to scale thickness can be thinner. In other example implementations, the bonding layer can be provided only in the region in which the device 40 is fastened to the plate element 41.

In FIG. 4C, regions 46A, 46B, and particularly 46C are identified which can be critical with respect to sound transmission, if the coupling medium assumes coefficients of thermal expansion which differ from the remainder to the device, which will apply in the event that conventional materials are employed. The detachment in region 46C, which would correspond to the interspace 35 according to FIG. 3, can be prevented by the provision of the reservoir space. Ultrasound coupling in region 46A can be ensured by a corresponding connection of the cover element 48 to the plate element 41. Given that, in both cases, these are solid bodies, comprising no gels or similar, materials can also be selected such that they assume similar coefficients of thermal expansion. With respect to region 46B, the height difference h is such that the edge regions of the cover element 48 do not contribute to sound transmission between the plate element 41 and the ultrasonic transducer 47.

Figure 5A:
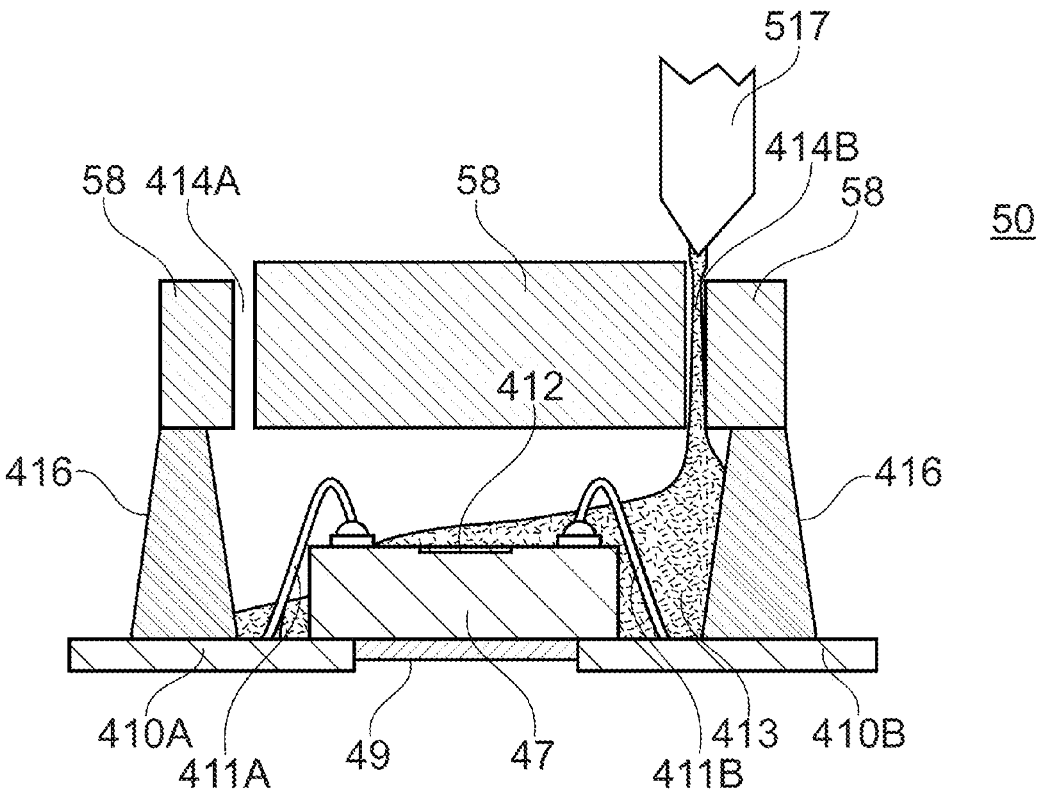
FIGS. 5A and 5B illustrate a device according to a further example implementation.
Figure 5B:
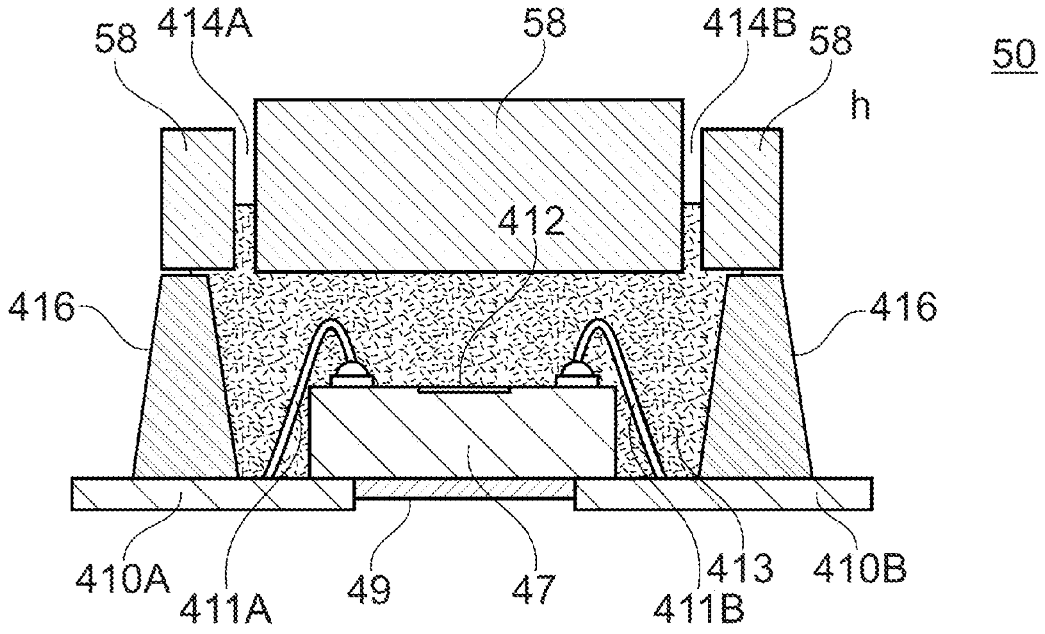

FIGS. 5A and 5B show a device 50 according to a further example implementation. The device 50 differs from the device 40 according to FIGS. 4A to 4C with respect to the configuration of the cover element, and with respect to assembly. The circuit board 49 with the corresponding contacts, the ultrasonic transducer 47 and the side walls 416 of the device 50 are configured as per the device 40, wherein corresponding elements carry the same reference symbols, and are not described again here. FIG. 5A shows a stage of the assembly or manufacture of the device 50, and FIG. 5*b* shows the finished device 50.

A cover element 58 of the device 50 according to FIGS. 5A and 5B also comprises the openings 414A, 414B. In the example implementation of the device 50, the cover element 58, at a side facing the ultrasonic transducer 47, assumes a planar form, and is fitted to the sidewalls 416. As represented in FIG. 5A, for the manufacture of the device 50, the coupling medium 413 using a nozzle 517, is introduced through one or more of the openings, in the example represented through the opening 414B, into the space defined by the circuit board 49, the sidewalls 416 and the cover element 58, such that it partially extends into the openings 414A, 414B. The outcome is represented in FIG. 5B. As per the device 40 according to FIGS. 4A to 4C, the openings 414A, 414B function as the reserve space, or part thereof, having the same effects as those described with reference to FIG. 4.

It should also be noted that, in the cover element 58, as per the cover element 48 according to FIGS. 4A to 4C, a central region can also be raised by a height h vis-à-vis an edge region. The device 50, as per the device 40 according to FIG. 4C, can then be fitted at its cover element 58 to a plate element 41. Excluding the above-mentioned differences, the same remarks regarding the device 40 according to FIGS. 4A to 4C also apply to the device 50 according to FIGS. 5A and 5B.

In the devices 40 and 50, a surface of the cover element 48 or 58 facing the membrane 412 is essentially flat. In other example implementations, this surface can be modified. Various examples hereof are described with respect to FIGS. 6A to 6E.

Figure 6A:
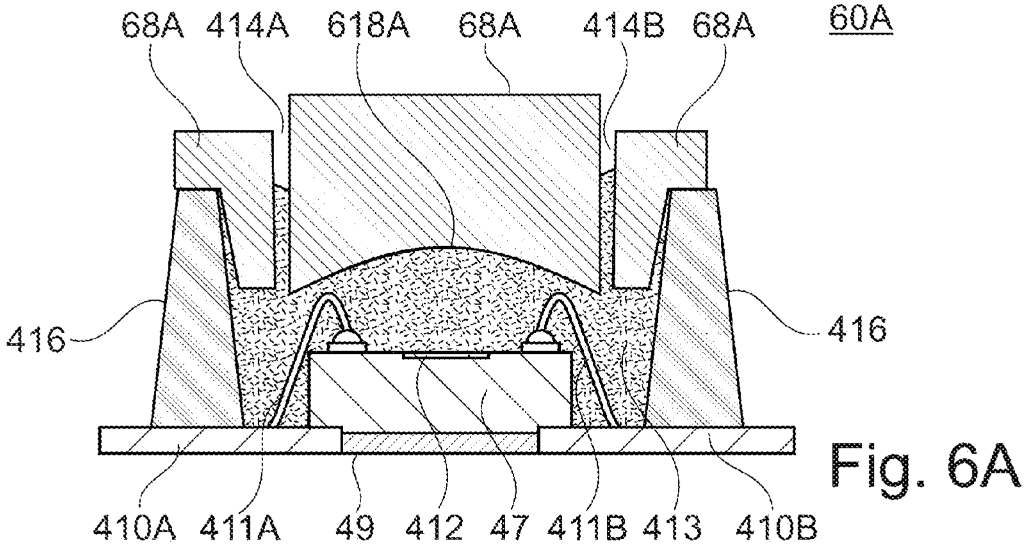
FIGS. 6A to 6E illustrate variations in devices according to various example implementations.
Figure 6B:
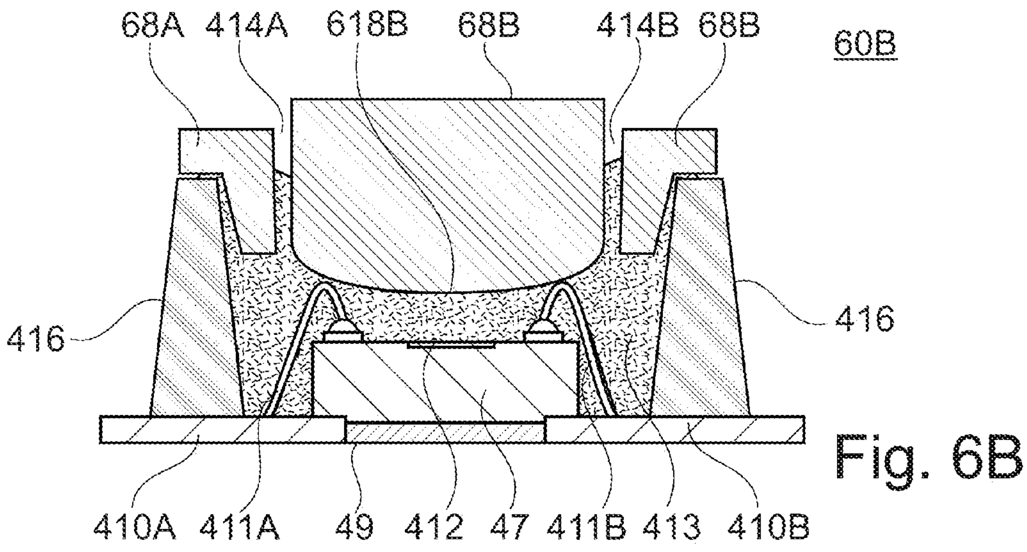

FIGS. 6A bis 6E show devices 60A to 60E which are variations of the device 40 according to FIGS. 4A to 4C, and which differ from the latter particularly with respect to the shape of a surface of the respective cover element which faces the membrane 412. The remaining elements carry the same reference symbols as per FIGS. 4A to 4C, and are not described again. The manufacturing process can also be the same as that described with reference to FIG. 4A. It should further be observed that the surface modification, as described hereinafter with reference to FIGS. 6A to 6E, can also be applied to the corresponding surface of the cover element 58 of the device 50 according to FIGS. 5A and 5B, although this is not described separately.

In the device 60A according to FIG. 6A, the cover element 68A, at a surface 618A facing the ultrasonic transducer 47, and particularly facing the membrane 412, assumes a concave shape, e.g., inwardly-curving away from the ultrasonic transducer 57. In the device 60B according to FIG. 6B, the cover element 68B, at a surface 618B facing the ultrasonic transducer 47, assumes a convex shape, e.g., outwardly-curving towards the ultrasonic transducer. Shapes of this type, in some coupling media, can prevent the formation of bubbles or interspaces in the coupling medium 413. Moreover, by this arrangement, in some example implementations, a lens function for ultrasound can be achieved, e.g., ultrasound can be focused or scattered, depending upon the required application. For example, using a lens function of this type, a region in which a system, as represented in FIG. 4C, is sensitive to contact by a finger 44 can be expanded or contracted as required.

Figure 6C:
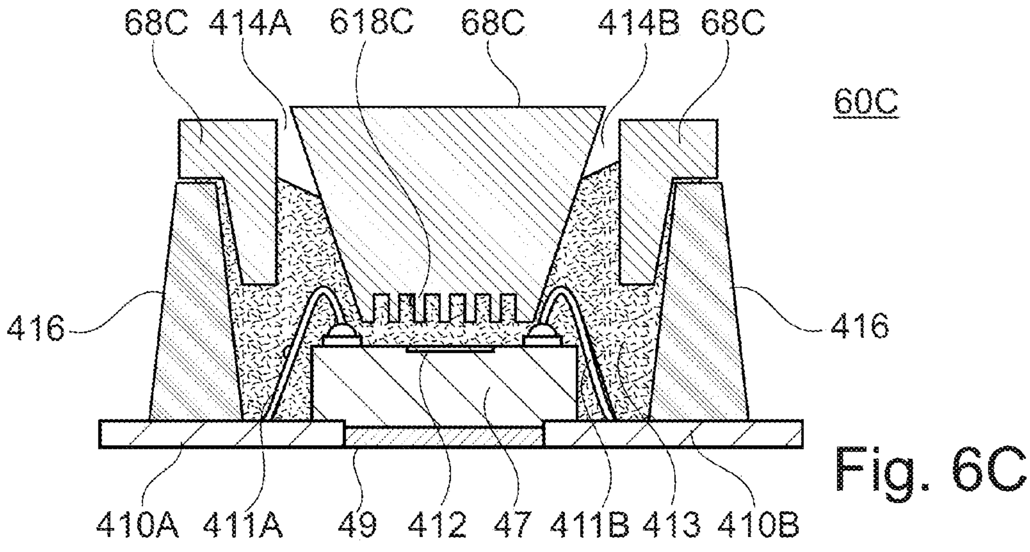

In the device 60C according to FIG. 6C, a central region of a cover element 68C is conically tapered towards the membrane 412, and a surface 618C which faces the membrane 412 comprises a grid structures. Grid structures of this type can be employed to generate interference for specific wavelengths. For example, by this arrangement, a constructive interference can be generated for a specific useful ultrasound wavelength, whereas other frequencies are damped.

Figure 6D:
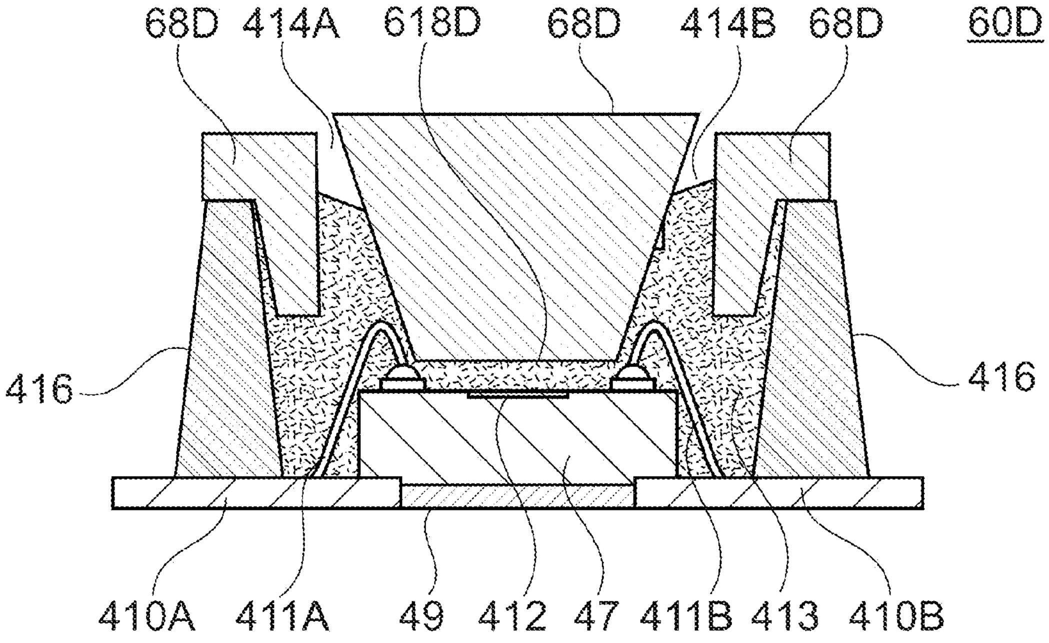

The device 60D according to FIG. 6D shows a similar variant to FIG. 6C, with a conically tapered central region of the cover element 68B wherein, in this case, a surface 618D of the cover element which faces the ultrasonic transducer 47 is flat. Using the conical shape, a spacing between the surface 618D and the membrane 412 can be reduced.

Figure 6E:
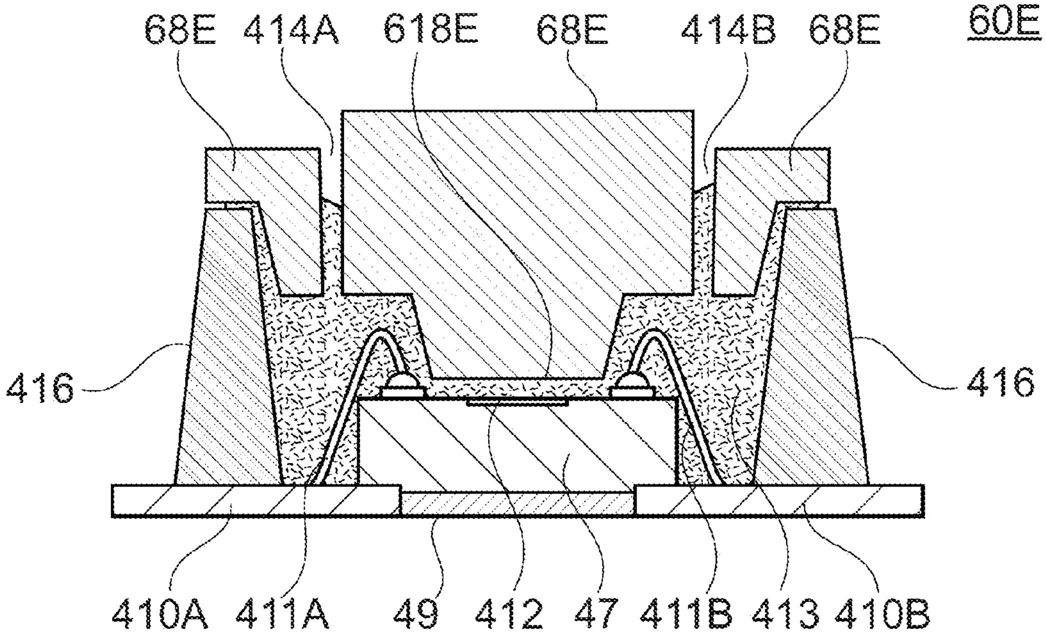

A further option for the reduction of spacing is shown in FIG. 6E. In this case, a cover element 68E of the device 60E, on a surface 618E facing the ultrasonic transducer 47, comprises a truncated cone-shaped or conically tapered projection, which also results in a small spacing between the cover element 68E and the membrane 412. Using a small spacing, the path which sound is required to describe through the coupling medium 413 is shortened such that, in some example implementations, switching losses can be reduced.

It should be observed that the various surfaces 618A to 618E according to FIGS. 6A to 6E can also be combined. For example, the concave surface 16A or the convex surface 618B according to FIGS. 6A and 6B can be provided additionally to a grid structure, as represented in FIG. 6C. Various surface modifications are thus possible, which also differ from those represented.

Figure 7A:
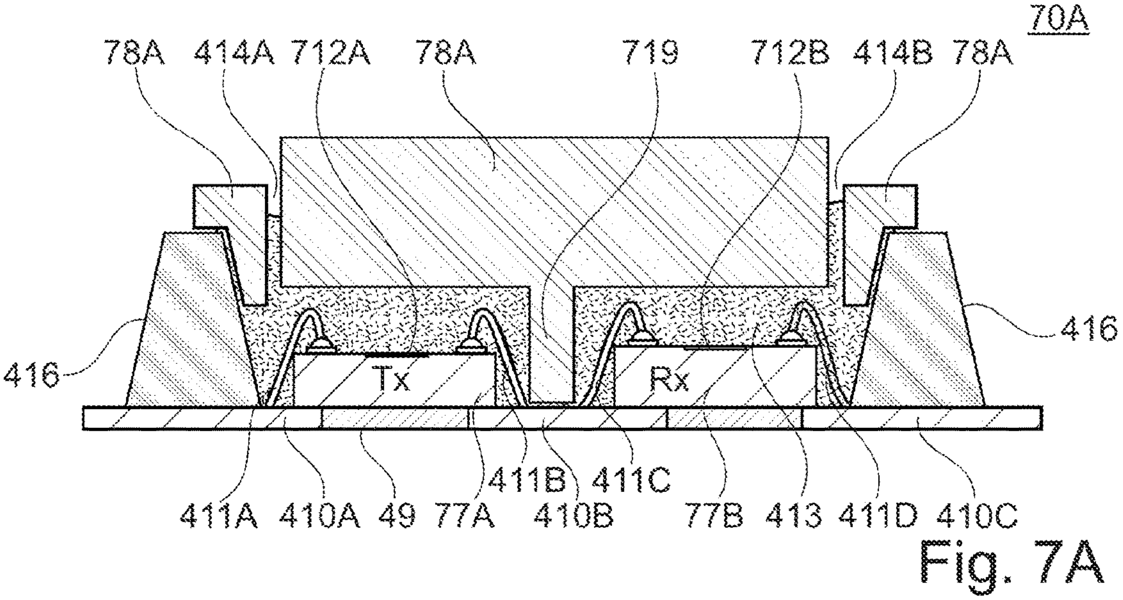
FIGS. 7A to 7D illustrate devices according to further example implementations.
Figure 7B:
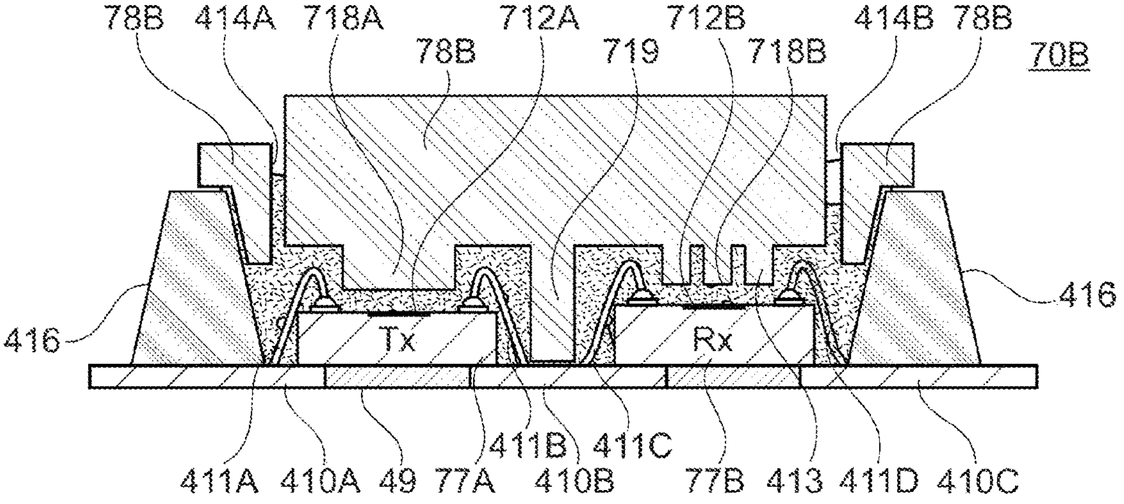
Figure 7C:
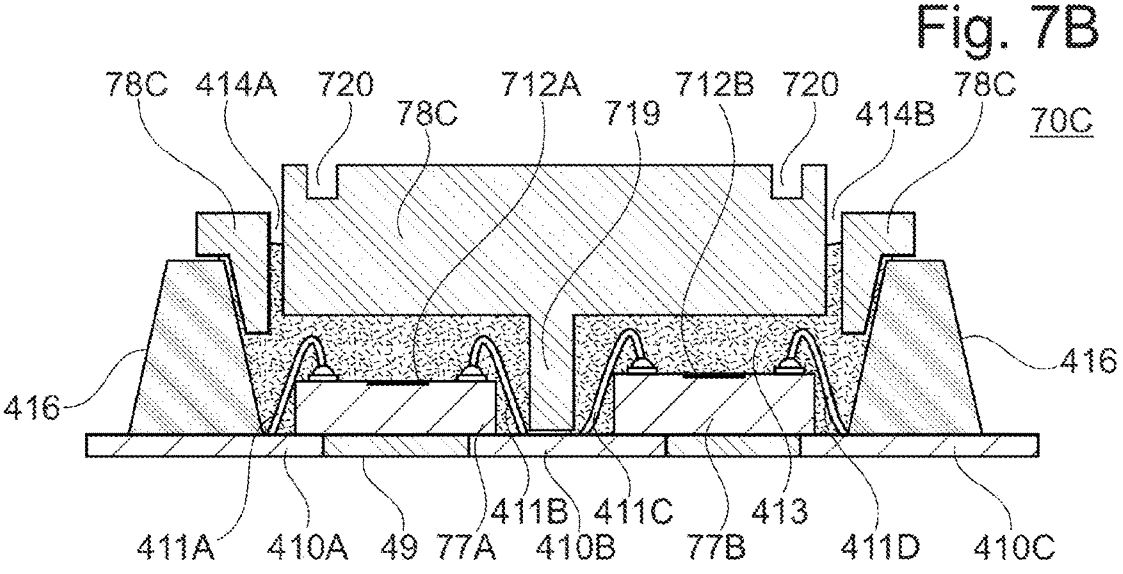

In the above example implementation, the ultrasonic transducer 47 comprises a single module having a single membrane. In other example implementations, more than one converter module can be employed. For example, two converter modules can be employed, wherein one converter module can be employed for transmitting sound waves, and the other converter module for receiving sound waves. Corresponding example implementations are represented in FIGS. 7A to 7C. These, in turn, are variations of the example implementations according to FIGS. 4A to 4C, and corresponding elements are identified by the same reference symbols. In a similar manner, configurations having two converter modules can also be implemented based on the example implementation according to FIG. 5A or 5C, or based on example implementations according to FIGS. 8A to 8E, as discussed hereinafter.

In a device 70A according to FIG. 7A, on the circuit board 49, a first converter module 77A having a first membrane 712A and a second converter module 77B having a second membrane 712B are provided. In the device 70A, the converter module 77A functions, for example, as a transmitter (Tx), and the converter module 77B functions as a receiver (Rx). Terminals of the converter modules 77A, 77B, as represented, are connected using bonding wires 411A, 411B, 411C and 411D to printed conductors 410A, 410B and 410C. Both converter modules 77A, 77B are thus connected using the printed conductor 410B, whereas printed conductor 410A is only bonded to the module 77A and printed conductor 410C is only bonded to the converter module 77B. For example, printed conductor 410B can be a ground terminal or can assume another reference potential, with respect to which other voltages can be applied to the printed conductors 410A, 410C, or can be tapped for the purposes of capacitance measurement.

The device 70A comprises a cover element 78A, which is substantially shaped as per the cover element 48 of the device 40 according to FIGS. 4A to 4C. It additionally comprises a projection 719, which projects between the converter modules 77A, 77B. In some implementations, acoustic separation of the transmission path from the reception path can thus be improved. It is not necessary for the projection 719 to extend completely to the circuit board 49, wherein it is only necessary for a proportion thereof to project between the converter modules 77A, 77B.

The device 70A otherwise corresponds to the above-mentioned device 40, including the manufacture thereof represented in FIG. 4A, wherein the cover element is likewise compressed into the coupling medium 413, such that coupling medium 413 enters the openings 414A, 414B.

FIG. 7B shows a device 70B, which is a variation of the device 70A according to FIG. 7A.

By way of distinction from the device 70A, the device 70B comprises a projection on the surface of the cover element 78B which faces the converter module 77A. This shortens a spacing between the membrane 712A and the cover element 78B. A surface 712B of the cover element 78B which faces the converter module 77B further comprises a grid structure, which can generate the interference effects described with reference to FIG. 6C. Other surface structures than those described with respect to FIGS. 6A to 6E can also be employed, independently of the surfaces 718A and 718B.

Figure 7D:
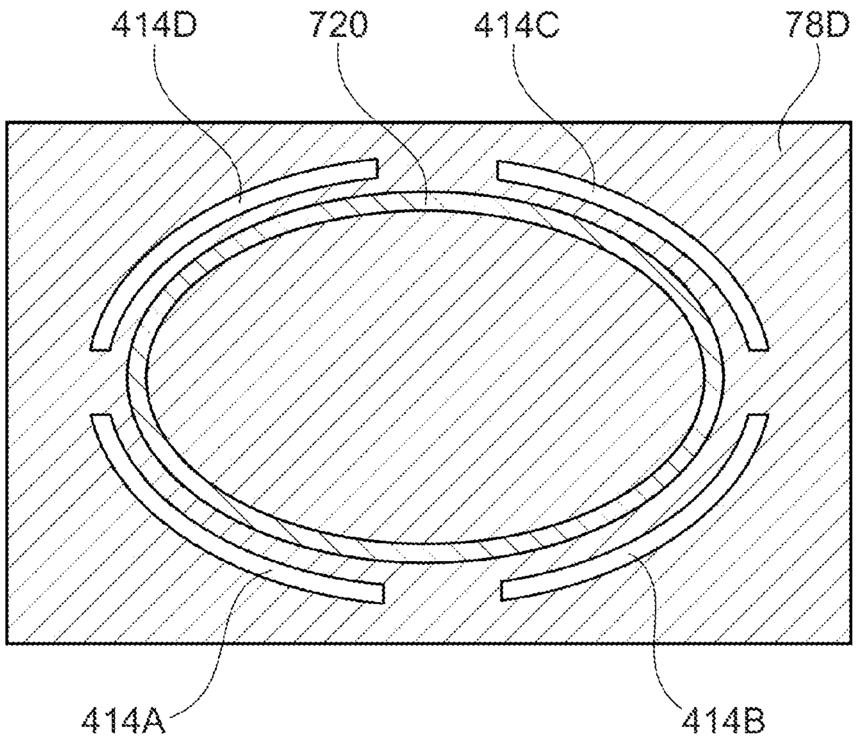

The device 70C according to FIG. 7C represents a further variation. In this case, a cover element 78C of the device 70C incorporates a circumferential recess 720 on the upper side. For illustrative purposes, FIG. 7D shows an overhead view of the cover element 78D. In this overhead view of example represented, a total of four slot-shaped openings 414A, 414B, 414C and 414D are shown, each of which extends over slightly less than one quarter of an ellipse. The recess 720 assumes a circumferential elliptical shape. Of the openings, in the cross-sectional view according to FIG. 7C, openings 414A, and 414B are visible. It should be observed that similarly shaped openings can also be employed in the other above-mentioned example implementations. In other example implementations, shapes other than elliptical shapes, for example rectangular shapes, quadratic shapes or circular shapes can be employed. The raised region of the cover element (c.f. height h according to FIGS. 4A to 4C and 5A, 5B) then lies within the ellipse on which the openings 414A to 414D are arranged. Additionally, in place of longitudinal slots, other shapes of opening are possible, for example circular openings, a plurality of shorter slot-shaped openings, etc.

Upon fastening to a plate element, as represented in FIG. 4C, the recess 720 can accommodate any surplus bonding means (for example the bonding layer 43 according to FIG. 4C), as a result of which the cover element can engage more effectively with the plate element. It should be observed that a recess of this type can also be provided in other example implementations represented herein, for example in the example implementations according to FIGS. 4, 5 and 6, or hereinafter in the corresponding sub-figures (A, B, etc.) according to FIG. 8. More than one recess can also be provided and/or, in other example implementations, the recess can be interrupted.

In the example implementations according to FIGS. 4 to 7, an ultrasonic transducer is provided on a circuit board, to which sidewalls are fitted, and a cover element comprises openings, which are employed as a reservoir space. However, the present application is not limited to this configuration. FIGS. 8A to 8E show devices 80A to 80D according to further example implementations, which assume another configuration.

Figure 8A:
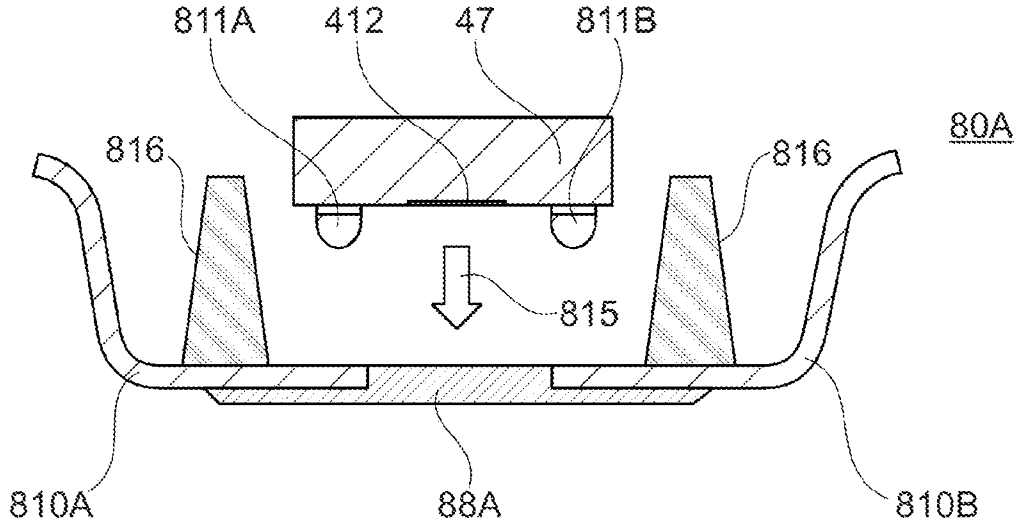
FIGS. 8A to 8E illustrate devices according to further example implementations.
Figure 8B:
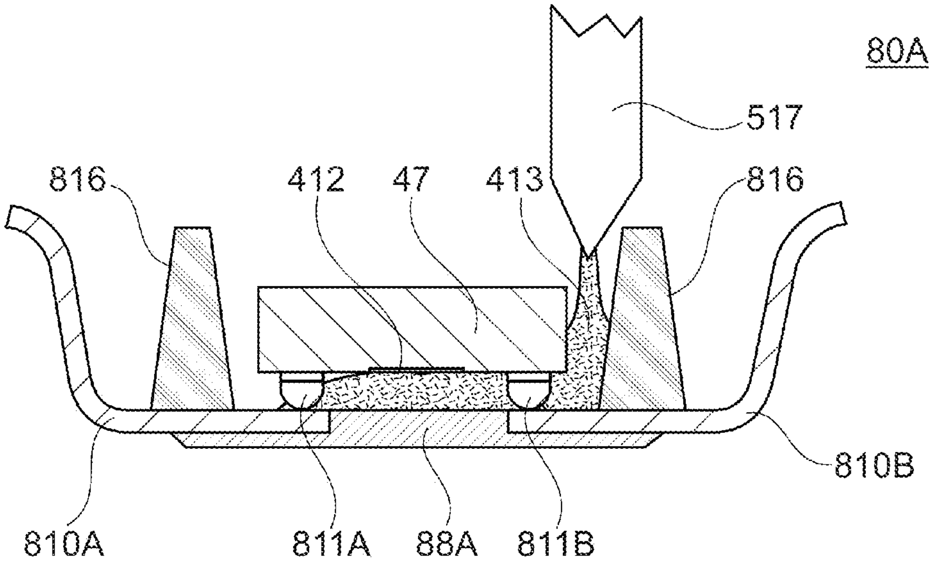
Figure 8C:
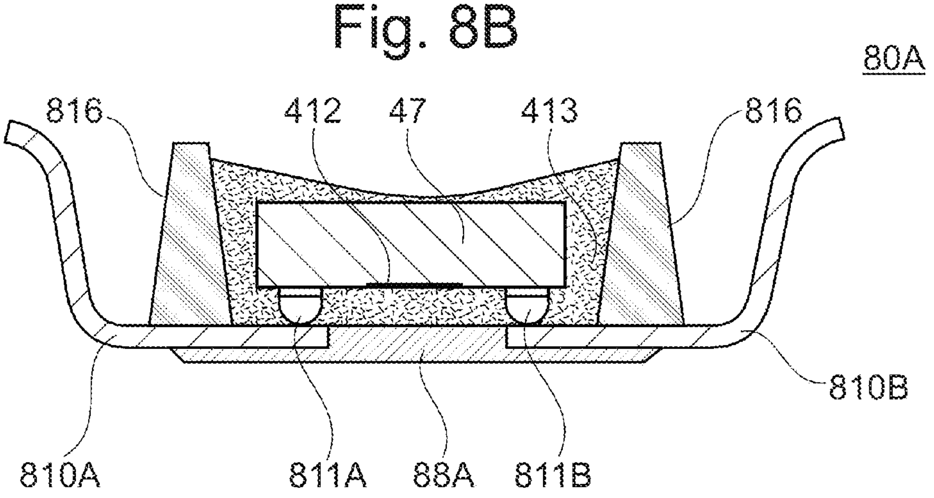

FIGS. 8A and 8B illustrate the manufacture of a device 80A according to one example implementation, and FIG. 8C shows the finished device 80A. The example implementations according to FIG. 8 are based upon the "flip chip" technique.

In the example implementation according to FIG. 8A, again, the above-mentioned ultrasonic transducer 47 is provided with the membrane 412. In the present example, the device 80A comprises two projecting contact elements 811A and 811B.

A circuit board 88A is moreover provided with sidewalls 816, and printed conductors 810A, 810B. As shown in FIG. 8A, the printed conductors 810A, 810B assume a curved shape which, in some implementations, can facilitate subsequent electrical contact-connection. In other implementations, other geometries are also possible, depending upon the ultimate geometry and arrangement adopted in a product. In this case, the circuit board 88A assumes the function of a cover element for covering the membrane and, at the same time, assumes an electrical contact-connection function. As will be further clarified hereinafter, the function of the circuit board 88A, with respect to electrical contact-connection, thus corresponds to that of the circuit board 49 in the above-mentioned example implementations and, with respect to sound conduction to and from the membrane, to that of the cover element according to the preceding example implementations.

For assembly, as indicated by an arrow 815 in FIG. 8A, the ultrasonic transducer 47 is fitted to the base element 88A such that the contact elements 811A and 811B are contact-connected with the printed conductors 810A or 810B, as shown in FIG. 8B. Fastening can be executed, for example, by soldering, or using a conductive bonding agent.

The printed conductors 810A and 810B are employed, as per the printed conductors 410A, 410B and 410C in the preceding example implementations, for the electrical contact-connection of the ultrasonic transducer 47, particularly for the application of DC and AC voltages, and for the measurement of capacitances, as described above.

As shown in FIG. 8B, by means the nozzle 517, the coupling medium 413 infill is introduced between the side walls 816. This firstly fills the interspace between the membrane 412 and the base element 88A which functions as a cover element. The infill of coupling medium, as shown in FIG. 8C, is executed to the extent that it entirely covers the ultrasonic transducer 47, including the side thereof which is averted from the base element 88A, as shown in FIG. 8C. In this case, the space at the sides of the ultrasonic transducer 47, and the region on the side of the ultrasonic transducer which is averted from the membrane 412, then function as a reservoir space, having the same effects as those described above.

Figure 8D:
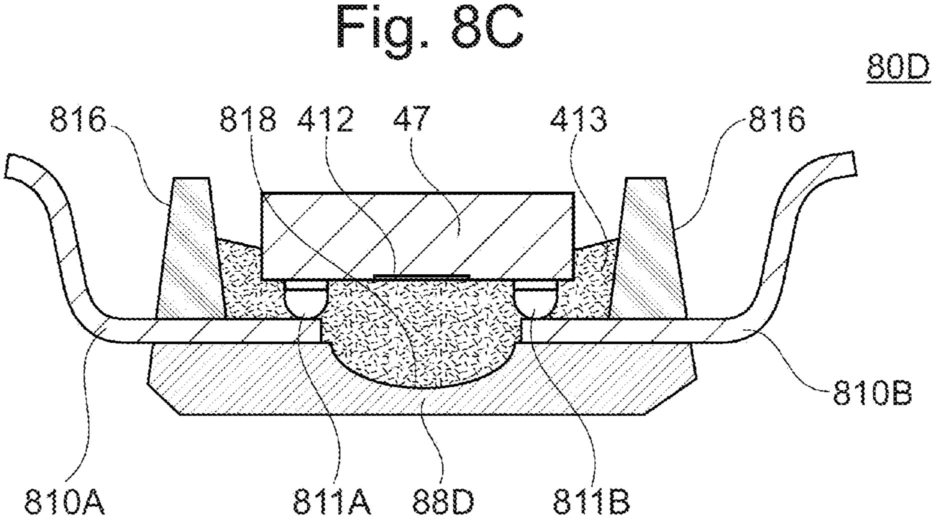

Above-mentioned modifications and variations of example implementations having a cover element are also applicable to the device 80A according to FIGS. 8A to 8C. As an example, FIG. 8D shows a device 80D, in which a surface 818 of a circuit board 88D, which is arranged opposite the membrane 412, is modified. In the example according to FIG. 8D, the surface 818 assumes a concave shape, corresponding to the concave shape of the surface 618A according to FIG. 6A. Other surface shapes according to FIG. 6 can also be applied to the device 80A. Moreover, as described with reference to FIG. 7, two converter modules can also be arranged next to one another, wherein the respective circuit board can then comprise a projection, which projects between the converter modules.

Figure 8E:
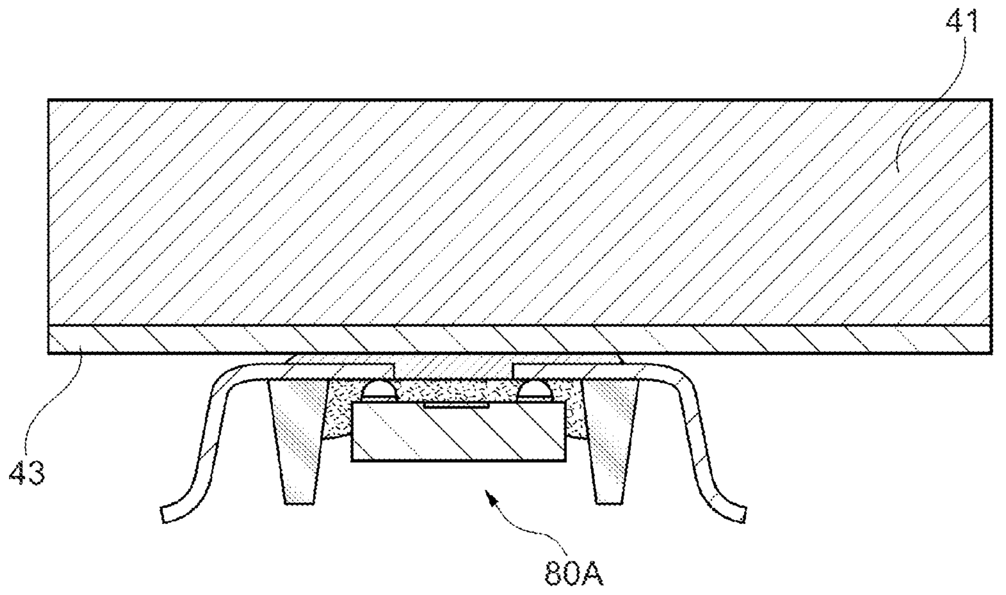

FIG. 8E shows an example implementation of the device 80A, which essentially corresponds to the example implementation according to FIG. 4C. In this case, the device 80A, at a side of the circuit board 88A which is averted from the membrane 412, is provided with the above-mentioned bonding layer 43, which is applied to the likewise above-mentioned plate element 41, as a result of which a touch-sensitive sensor can be implemented. For the accommodation of surplus bonding agent 43, a recess can be provided in the circuit board 88A, as per the recess 720 according to FIGS. 7C and 7D. Variants of the preceding example implementations are also applicable to the example implementations according to FIG. 8.

Figure 9:
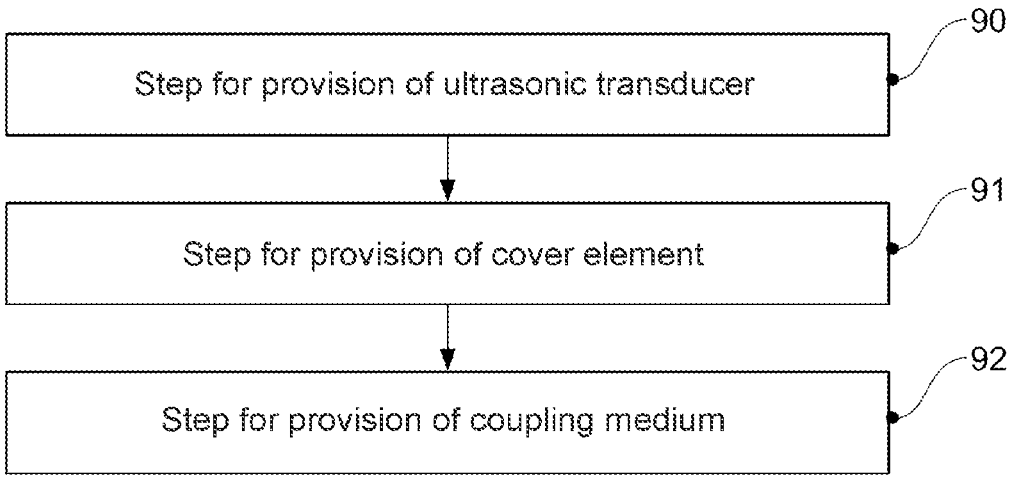
FIG. 9 is a flow diagram for the methodological illustration of an example implementation.

FIG. 9 shows a flow diagram for the illustration of a method according to one example implementation. The method according to FIG. 9 is employed for manufacturing one of the above-mentioned devices, and is described with reference thereto.

In step 90, the method comprises the provision of an ultrasonic transducer, such as the ultrasonic transducer 47, which can also comprise a plurality of converter modules, such as the converter modules 77A, 77B according to FIG. 7. In step 91, a covering element is provided. This can be a cover element, as per FIGS. 4 to 7, or a base element, as per FIG. 8.

In step 92, the method comprises the provision of a coupling medium such that it entirely fulfils an interspace between a (membrane or plurality of membranes) of the ultrasonic transducer and the cover element, and additionally extends into a reservoir space. Provision of the coupling medium can comprise an infill thereof using a nozzle, as represented in FIG. 8B or 5A, or the coupling medium can initially be provided between sidewalls, and a cover element fitted thereof, as represented in FIG. 4A. Other types of provision are also possible. Provided that sufficient contact can be ensured, for example prior to the step illustrated in FIG. 8A, an infill of at least a proportion of the coupling medium can be completed beforehand, which is then laterally displaced by the ultrasonic transducer 47.

ASPECTS

Some aspect implementations are defined by the following aspects:

Aspect 1. A device, comprising:

an ultrasonic transducer having a membrane, a cover element which is spaced from the ultrasonic transducer, and a coupling medium, which entirely fills an interspace between the membrane and the cover element, and extends from the interspace into a reservoir space which communicates with the interspace.

Aspect 2. The device according to aspect 1, wherein the coupling medium extends into the reservoir space such that, upon expansion, it expands into the reservoir space and, upon contraction, retracts from the reservoir space, whereas the interspace remains entirely filled with gel.

Aspect 3. The device according to aspects 1 or 2, wherein the coupling medium comprises a gel.

Aspect 4. The device according to one of aspects 1 to 3, wherein a surface of the cover element facing the membrane assumes a curved shape.

Aspect 5. The device according to one of aspects 1 to 4, wherein a surface of the cover element facing the membrane comprises a grid structure.

Aspect 6. The device according to one of aspects 1 to 5, wherein a surface of the cover element facing the membrane, and arranged opposite the membrane, comprises a step which reduces a spacing between the cover element and the membrane.

Aspect 7. The device according to one of aspects 1 to 6, wherein a surface of the cover element which is averted from the membrane, at least in a region above the membrane, assumes a planar form.

Aspect 8. The device according to one of aspects 1 to 6, wherein the ultrasonic transducer comprises a first converter module having a first membrane and a second converter module having a second membrane, wherein the interspace comprises a firs interspace between the first membrane and the cover element, and a second interspace between the second membrane and the cover element.

Aspect 9. The device according to aspect 8, wherein a surface of the cover element facing the ultrasonic transducer comprises a projection which extends between the first converter module and the second converter module.

Aspect 10. The device according to one of aspects 1 to 9, further comprising a base element having electrically conductive elements, wherein the ultrasonic transducer is fitted to the base element and electrically connected to the electrically conductive elements, wherein the cover element and the base element are arranged on opposite sides of the ultrasonic transducer.

Aspect 11. The device according to aspect 10, wherein the cover element comprises at least one opening, and wherein the reservoir space comprises at least a proportion of the at least one opening.

Aspect 12. The device according to aspect 11, wherein the at least one opening comprises a plurality of curved and slot-shaped openings.

Aspect 13. The device according to one of aspects 10 to 12, wherein sidewalls are fitted to the base element, and wherein the cover element covers the sidewalls.

Aspect 14. The device according to one of aspects 1 to 9, wherein the cover element comprises electrically conductive elements, wherein the ultrasonic transducer, using electrically conductive contact elements which are arranged on the same side of the ultrasonic transducer as the membrane, is electrically connected to the electrically conductive elements.

Aspect 15. The device according to aspect 14, wherein sidewalls are fitted to the cover element, wherein the reservoir space comprises a region between the ultrasonic transducer and the sidewalls and/or a region which is located on a side of the membrane which is averted from the ultrasonic transducer.

Aspect 16. A system, comprising: a plate element, and the device according to one of aspects 1 to 15, wherein the cover element is fitted to a side of the plate element which is averted from the ultrasonic transducer.

Aspect 17. A method for manufacturing a device according to one of aspects 1 to 15, comprising: provision of the ultrasonic transducer, provision of the cover element, and provision of the coupling medium in the interspace and in at least part of the reservoir space.

Aspect 18. The method according to aspect 17, wherein the device is configured according to one of aspects 10 to 13, wherein the coupling medium is provided on the base element and the ultrasonic transducer, and the cover element is then arranged such that the coupling medium is at least partially displaced into the reservoir space.

Aspect 19. The method according to aspect 17, wherein the device is configured according to one of aspects 10 to 13, wherein the base element having the ultrasonic transducer and the cover element are provided, and an infill of coupling medium is then introduced into the interspace and at least partially into the reservoir space.

Aspect 20. The method according to aspect 19, wherein the device is configured according to aspects 11 or 12, wherein the infill of coupling medium is introduced through an opening of the at least one opening into the interspace and at least partially into the reservoir space.

Aspect 21. The method according to aspect 17, wherein the device is configured according to aspects 14 or 15, wherein the ultrasonic transducer is connected to the cover element using the electrically conductive contact elements, and the infill of coupling medium is then introduced into the interspace and at least partially into the reservoir space.

Although, in the present description, specific aspect implementations have been illustrated and described, persons who are customarily skilled in the art will observe that a plurality of alternative and/or equivalent implementations can be preferred by way of substitution for the specific aspect implementations disclosed and described in the present description, without departing from the scope of the implementation disclosed. The present application is intended to encompass all adaptations or variations of the specific aspect implementations which are discussed herein. It is thus intended that the present implementation should only be limited by the claims and equivalent elements to the claims.

What is claimed is:

1. A device, comprising:

an ultrasonic transducer having a membrane;

a cover element which is spaced from the ultrasonic transducer; and a coupling medium, which entirely fills an interspace between the membrane and the cover element, and which extends from the interspace into a reservoir space which communicates with the interspace, wherein the coupling medium partially fills the reservoir space, wherein thermal expansion causes the coupling medium to flow from the interspace and into the reservoir space while the interspace remains entirely filled with the coupling medium, and wherein thermal contraction causes the coupling medium to flow from the reservoir space and into the interspace to cause the interspace to remain entirely filled with the coupling medium.

2. The device as claimed in claim 1, wherein the reservoir space is separate from the interspace.

3. The device as claimed in claim 1, wherein the coupling medium comprises a gel.

4. The device as claimed in claim 1, wherein a surface of the cover element facing the membrane assumes a curved shape.

5. The device as claimed in claim 1, wherein a surface of the cover element facing the membrane comprises a grid structure.

6. The device as claimed in claim 1, wherein a first surface of the cover element facing the membrane, and a second surface of the cover element arranged opposite the membrane, comprise a step which reduces a spacing between the cover element and the membrane.

7. The device as claimed in claim 1, wherein a surface of the cover element which is averted from the membrane, at least in a region above the membrane, assumes a planar form.

8. The device as claimed in claim 1, wherein the ultrasonic transducer comprises a first converter module having a first membrane and a second converter module having a second membrane, and wherein the interspace comprises a first interspace between the first membrane and the cover element and a second interspace between the second membrane and the cover element.

9. The device as claimed in claim 8, wherein a surface of the cover element facing the ultrasonic transducer comprises a projection which extends between the first converter module and the second converter module.

10. The device as claimed in claim 1, further comprising:

a base element having electrically conductive elements, wherein the ultrasonic transducer is fitted to the base element and is electrically connected to the electrically conductive elements, and wherein the cover element and the base element are arranged on opposite sides of the ultrasonic transducer.

11. The device as claimed in claim 10, wherein the cover element comprises at least one opening, and wherein the reservoir space comprises at least a proportion of the at least one opening.

12. The device as claimed in claim 11, wherein the at least one opening comprises a plurality openings that are curved and slot-shaped.

13. The device as claimed in claim 10, wherein sidewalls are fitted to the base element, and wherein the cover element covers the sidewalls.

14. The device as claimed in claim 1, wherein the cover element comprises electrically conductive elements, and wherein the ultrasonic transducer, using electrically conductive contact elements, which are arranged on the ultrasonic transducer on a same side of the ultrasonic transducer as the membrane, is connected to the electrically conductive elements.

15. The device as claimed in claim 14, wherein sidewalls are fitted to the cover element, and wherein the reservoir space comprises one or more of:

a region between the ultrasonic transducer and the sidewalls, or a region on a side of the ultrasonic transducer which is averted from the membrane.

16. A system, comprising:

a plate element, and a device comprising:

an ultrasonic transducer having a membrane;

a cover element which is spaced from the ultrasonic transducer; and a coupling medium, which entirely fills an interspace between the membrane and the cover element, and which extends from the interspace into a reservoir space which communicates with the interspace, wherein the coupling medium partially fills the reservoir space, wherein thermal expansion causes the coupling medium to flow from the interspace and into the reservoir space while the interspace remains entirely filled with the coupling medium, and wherein thermal contraction causes the coupling medium to flow from the reservoir space and into the interspace to cause the interspace to remain entirely filled with the coupling medium, wherein the cover element is fitted to a side of the plate element which is facing the ultrasonic transducer.

17. A method for manufacturing a device comprising an ultrasonic transducer having a membrane; a cover element which is spaced from the ultrasonic transducer; and a coupling medium, which entirely fills an interspace between the membrane and the cover element, and which extends from the interspace into a reservoir space which communicates with the interspace, the method comprising:

providing the ultrasonic transducer;

providing the cover element;

providing the coupling medium in the interspace and in at least part of the reservoir space; and communicating the coupling medium between the interspace and the reservoir space based on thermal expansion or thermal contraction of the coupling medium, wherein the coupling medium partially fills the reservoir space, wherein thermal expansion causes the coupling medium to flow from the interspace and into the reservoir space while the interspace remains entirely filled with the coupling medium, and wherein thermal contraction causes the coupling medium to flow from the reservoir space and into the interspace to cause the interspace to remain entirely filled with the coupling medium.

18. The method as claimed in claim 17, wherein the device further comprises a base element having electrically conductive elements, wherein the ultrasonic transducer is fitted to the base element and is electrically connected to the electrically conductive elements, and wherein the cover element and the base element are arranged on opposite sides of the ultrasonic transducer, the method further comprising:

providing the coupling medium on the base element and the ultrasonic transducer; and arranging, after providing the coupling medium on the base element and the ultrasonic transducer, the cover element such that the coupling medium is at least partially displaced into the reservoir space.

19. The method as claimed in claim 17, wherein a surface of the cover element facing the membrane assumes a curved shape.

20. The method as claimed in claim 17, wherein a surface of the cover element facing the membrane comprises a grid structure.

* * * * *